United States Patent
Gulbransen et al.

(10) Patent No.: US 12,261,186 B2
(45) Date of Patent: Mar. 25, 2025

(54) MOSAIC FOCAL PLANE ARRAY

(71) Applicant: Raytheon Company, Waltham, MA (US)

(72) Inventors: David J. Gulbransen, McKinney, TX (US); Sean P. Kilcoyne, Lompoc, CA (US); Eric Miller, Lompoc, CA (US); Matthew D. Chambers, Goleta, CA (US); Eric J. Beuville, Goleta, CA (US); Andrew E. Gin, Goleta, CA (US); Adam M. Kennedy, Goleta, CA (US)

(73) Assignee: Raytheon Company, Arlington, VA (US)

( * ) Notice: Subject to any disclaimer, the term of this patent is extended or adjusted under 35 U.S.C. 154(b) by 517 days.

(21) Appl. No.: 17/212,085

(22) Filed: Mar. 25, 2021

(65) Prior Publication Data

US 2022/0310690 A1    Sep. 29, 2022

(51) Int. Cl.
*H01L 25/00*   (2006.01)
*H01L 21/66*   (2006.01)
*H01L 23/00*   (2006.01)
*H01L 27/146*  (2006.01)

(52) U.S. Cl.
CPC ........ *H01L 27/14634* (2013.01); *H01L 22/14* (2013.01); *H01L 24/97* (2013.01); *H01L 27/14649* (2013.01); *H01L 27/14663* (2013.01); *H01L 27/1469* (2013.01)

(58) Field of Classification Search
CPC ... H01L 27/14634; H01L 22/14; H01L 24/97; H01L 27/14649; H01L 27/14663; H01L 27/1469; H01L 2224/08145
See application file for complete search history.

(56) References Cited

U.S. PATENT DOCUMENTS

| | | | |
|---|---|---|---|
| 9,599,723 B2 | 3/2017 | Jadrich et al. | |
| 10,515,837 B2 | 12/2019 | Kilcoyne et al. | |
| 10,530,380 B2 | 1/2020 | Beuville et al. | |
| 2009/0268983 A1 | 10/2009 | Stone et al. | |
| 2011/0147568 A1* | 6/2011 | Miyake | H05K 7/1061 361/728 |
| 2012/0133001 A1* | 5/2012 | Tkaczyk | A61B 8/4483 438/66 |
| 2017/0005072 A1* | 1/2017 | Wei | H01L 25/18 |

(Continued)

OTHER PUBLICATIONS

Suntharalingam et al., "A 4-Side Tileable Back Illuminated 3D-Integrated Mpixel CMOS Image Sensor", Digest of Technical Papers, 2009 IEEE International Solid-State Circuits Conference, 978-1-4244-3457.

*Primary Examiner* — Samuel Park (57) ABSTRACT

A focal plane array includes a mosaic integrated circuit device having a plurality of discrete integrated circuit tiles mounted on a motherboard. The focal plane array includes an optically continuous detector array electrically connected to the mosaic integrated circuit device with an interposer disposed therebetween. The interposer is configured to adjust a pitch of the continuous detector array to match a pitch of each of the plurality of discrete integrated circuit tiles so that the optical gaps between each of the plurality of integrated circuit tiles on the motherboard are minimized and the detector array is optically continuous, having high yield over the large format focal plane array.

21 Claims, 7 Drawing Sheets

(56) References Cited

U.S. PATENT DOCUMENTS

| | | | |
|---|---|---|---|
| 2017/0026598 A1* | 1/2017 | Fahim | H04N 5/32 |
| 2018/0007248 A1* | 1/2018 | Zeise | B64U 20/87 |
| 2018/0301365 A1 | 10/2018 | Kilcoyne et al. | |
| 2019/0221547 A1* | 7/2019 | Drab | H01L 21/561 |
| 2019/0355706 A1* | 11/2019 | Enquist | H01L 27/1469 |
| 2020/0286871 A1* | 9/2020 | Liff | H01L 27/14634 |
| 2021/0098381 A1* | 4/2021 | Yu | H01L 21/4857 |

* cited by examiner

MOSAIC FOCAL PLANE ARRAY

TECHNICAL FIELD

The present invention relates generally to focal plane arrays and more particularly to large format focal plane arrays.

BACKGROUND

Focal plane arrays (FPAs) are image sensors consisting of an array of light sensing pixels at the focal plane of a lens. FPAs include a detector array interconnected with an integrated circuit, such as a read-out integrated circuit (ROIC) with interconnect attachment joints, such as indium bump interconnects. There is a growing need for very large focal plane arrays (FPAs), for example, in tactical and space applications. This is particularly true for distributed aperture sensors for airborne and ship-based situational awareness. Prior attempts at making large FPAs have included using a large single integrated circuit device. The large size of these FPAs, however, makes it difficult to achieve an affordable yield for the underlying integrated circuit device, especially when the functionality needed for the FPA requires a 3D integrated circuit to fit the required circuitry into the available pixel area. This is because electrical yield for an integrated circuit device scales inversely with the die area and for 3D integrated circuit devices, the yield of each layer is multiplied together. For example, a 3D integrated circuit device including two layers, each layer having a 20% yield, will have a resultant 4% yield (20%×20%=4%).

Other solutions, therefore, have included making a mosaic array of smaller hybrid detectors to increase yield with micro optics in an attempt to minimize optical gaps between mosaic detectors. Mechanical dithering has been attempted to fill in the gaps, however this typically results in a lower overall frame rate for the full mosaic image. Similarly, a stare-step approach has also been attempted to allow a single smaller sensor to cover a larger field of regard, albeit at a slower overall frame or revisit rate. Other solutions have used four loosely spaced mosaic FPAs with independent bore sighted optics covering the same field of view to create a continuous image, or multiple independent cameras whose fields of view overlap to create a larger image.

SUMMARY

To solve the aforementioned problems associated with large format FPAs, a mosaic integrated circuit device including a plurality of small format, high yield integrated circuit tiles are arranged together to create a large format FPA, according to a general embodiment. For example, a 1 k×1 k integrated circuit tile serves as a building block to form an mk×nk mosaic integrated circuit. The mosaic integrated circuit is electrically connected to an optically continuous detector array with an interposer disposed therebetween. The interposer is configured to adjust a pitch of the detector array to match a pitch of each of the integrated circuit tiles in the mosaic integrated circuit. In this way, the large format FPA having the mosaic integrated circuit overcomes the yield issues typically experienced in prior solutions and creates a seamless FPA resultant image. Composite wafer construction from known good integrated circuit tiles allows for wafer level bonding of the detector array and interposer to the mosaic integrated circuit. This composite wafer construction technology is patented and described in U.S. Pat. No. 10,515,837, which is incorporated herein by reference.

Each integrated circuit tile may be configured in a 3-dimensional configuration to minimize peripheral area outside the detector pixel array. For example, two or more integrated circuit dies may be stacked upon each other to form a multi-tiered integrated circuit tile. The small die size of each integrated circuit die helps achieve a high resultant yield of the mosaic integrated circuit device.

According to an aspect of the invention, a focal plane array includes a mosaic integrated circuit device including a plurality of discrete integrated circuit tiles having a first face mounted on a motherboard. The focal plane array also includes an optically continuous detector array electrically connected to a second face of each of the plurality of integrated circuit tiles of the mosaic integrated circuit device. The focal plane array additionally includes an interposer disposed between the detector array and the second face of each of the plurality of integrated circuit tiles of the mosaic integrated circuit device. The interposer is configured to adjust a pitch of the detector array to match a smaller or larger pitch of each of the plurality of integrated circuit tiles to minimize the optical gaps between each of the plurality of integrated circuit tiles.

According to an embodiment of any paragraph(s) of this summary, the plurality of integrated circuit tiles are read-out integrated circuit devices.

According to another embodiment of any paragraph(s) of this summary, the plurality of integrated circuit tiles include two or more vertically stacked integrated circuit dies.

According to another embodiment of any paragraph(s) of this summary, the interposer is a passive interposer.

According to another embodiment of any paragraph(s) of this summary, the interposer includes a fan-in or fan-out structure for matching the pitch of the detector array to the pitch of each of the plurality of integrated circuit tiles.

According to another embodiment of any paragraph(s) of this summary, a coefficient of thermal expansion of the detector array matches a coefficient of thermal expansion of the mosaic integrated circuit device.

According to another embodiment of any paragraph(s) of this summary, the plurality of integrated circuit tiles of the mosaic integrated circuit device are in a square configuration.

According to another embodiment of any paragraph(s) of this summary, the plurality of integrated circuit tiles of the mosaic integrated circuit device are in a rectangular configuration.

According to another embodiment of any paragraph(s) of this summary, the plurality of integrated circuit tiles of the mosaic integrated circuit device are in a circular configuration.

According to another embodiment of any paragraph(s) of this summary, the detector array is at least one of an infrared detector, a visible detector, a UV detector, and an x-ray detector.

According to another embodiment of any paragraph(s) of this summary, the detector array is a micro-bolometer or other monolithically integrated detector material.

According to another aspect of the invention, a method of fabricating a focal plane array includes bonding a face of a detector array to a first face of an interposer. The interposer has a second face supported on an interposer substrate. The method also includes providing a mosaic integrated circuit device. The mosaic integrated circuit device includes a plurality of discrete integrated circuit tiles supported on a common integrated circuit substrate at a first face of each the plurality of integrated circuit tiles. Each of the plurality of integrated circuit tiles also has a second face opposite the first face supported on an integrated circuit tile substrate. The method also includes removing the integrated circuit tile substrate from the second face of each of the plurality of integrated circuit tiles and removing the interposer substrate from the second face of the interposer. The method then includes bonding the second face of each of the plurality of integrated circuit tiles to the second face of the interposer. The method then includes removing the common integrated circuit substrate from the first face of each of the plurality of integrated circuit tiles and mounting the first face of each of the plurality of integrated circuit tiles to a motherboard.

According to an embodiment of any paragraph(s) of this summary, the method further includes preparing the face of the detector array and the first face of the interposer for bonding before bonding the face of the detector array to the first face of the interposer.

According to another embodiment of any paragraph(s) of this summary, the method further includes preparing the second face of the interposer and the second face of each of the plurality of integrated circuit tiles for bonding before bonding the second face of each of the plurality of discrete integrated circuit tiles to the second face of the interposer.

According to another embodiment of any paragraph(s) of this summary, the method further includes adding I/O probe pads to the first face of each of the plurality of integrated circuit tiles and testing the mosaic integrated circuit device before mounting the first face of each of the plurality of discrete integrated circuit tiles to the motherboard.

According to another embodiment of any paragraph(s) of this summary, the method further includes adding ball grid array (BGA) bumps to the first face of each of the plurality of integrated circuit tiles before mounting the first face of each of the plurality of integrated circuit tiles to the motherboard.

According to yet another aspect of the invention, a method of fabricating a focal plane array includes providing a mosaic integrated circuit device. The mosaic integrated circuit device including a plurality of discrete integrated circuit tiles supported on a common integrated circuit substrate at a first face of each the plurality of integrated circuit tiles. Each of the plurality of integrated circuit tiles having a second face opposite the first face supported on an integrated circuit tile substrate. The method includes removing the integrated circuit tile substrate from the second face of each of the plurality of integrated circuit tiles and bonding a first face of an interposer to the second face of each of the integrated circuit tiles. The interposer has a second face supported on an interposer substrate. The method then includes removing the interposer substrate from the second face of the interposer and fabricating a detector on the second face of the interposer. The method then includes removing the common integrated circuit substrate from the first face of each of the plurality of integrated circuit tiles and mounting the first face of each of the plurality of integrated circuit tiles to a motherboard.

According to an embodiment of any paragraph(s) of this summary, the detector is a monolithically integrated detector including one of a micro-bolometer, a mercury cadmium telluride (HgCdTe) detector, a graphene or other nano wire detector, a silicon-germanium (SeGe) detector, a silicon-germanium tin (SeGeSn) detector, a lead selenide (PbSe) or other lead based detector, a nano-particle detector, or a quantum-dot detector.

According to an embodiment of any paragraph(s) of this summary, the method further includes preparing the second face of each of the plurality of integrated circuit tiles and the second face of the interposer for bonding before bonding the second face of each of the integrated circuit tiles to the second face of the interposer.

According to another embodiment of any paragraph(s) of this summary, the method further includes adding I/O probe pads to the first face of each of the plurality of integrated circuit tiles and testing the mosaic integrated circuit device before mounting the first face of each of the plurality of discrete integrated circuit tiles to the motherboard.

According to another embodiment of any paragraph(s) of this summary, the method further includes adding ball grid array bumps to the first face of each of the plurality of integrated circuit tiles before mounting the first face of each of the plurality of integrated circuit tiles to the motherboard.

The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

According to a general embodiment, a focal plane array includes a mosaic integrated circuit device having a plurality of discrete integrated circuit tiles mounted on a motherboard. The focal plane array includes an optically continuous detector array electrically connected to the mosaic integrated circuit device with an interposer disposed therebetween. The interposer is configured to adjust a pitch of the continuous detector array to match a smaller or larger pitch of each of the plurality of discrete integrated circuit tiles so that the optical gaps between each of the plurality of integrated circuit tiles on the motherboard are minimized and the detector array is optically continuous, having high yield over the large format focal plane array.

Figure 1:
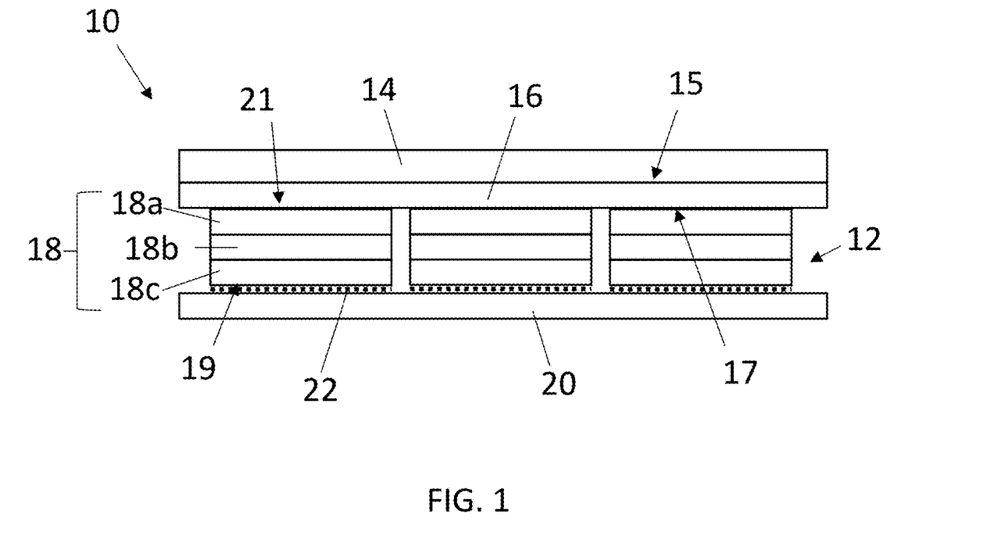
FIG. 1 is a schematic diagram of a focal plane array.

Turning now to the figures and initially to FIG. 1, an exemplary focal plane array 10 includes a mosaic integrated circuit device 12 and an optically continuous detector array 14 electrically connected to the mosaic integrated circuit device 12 with an interposer 16 disposed therebetween. The mosaic integrated circuit device 12 includes a plurality of discrete integrated circuit tiles 18, each having a first face 19 and a second face 21 opposite the first face 19 of the integrated circuit tiles 18. The interposer 16 also has a first face 15 and a second face 17 opposite the first face 15 of the interposer 16. The first face 19 of each of the plurality of integrated circuit tiles 18 is mounted on a motherboard 20 with, for example, ball grid array (BGA) bonds 22. The second face 21 of each of the plurality of integrated circuit tiles 18 is bonded to the second face 17 of the interposer 16. The first face 15 of the interposer 16 is bonded to the detector array 14. The motherboard 20, for example, may be a ceramic or silicon motherboard. The detector array 14 may be, for example, at least one of an infrared detector, a visible detector, a UV detector, micro-bolometer, and an x-ray detector. The detector array 14 may in general be any device capable of converting incident electromagnetic energy in the x-ray to far infrared spectral region into an electronic signal. The detector array 14 may be fabricated on a detector substrate having a coefficient of thermal expansion (CTE) that matches a substrate of the mosaic integrated circuit device 12 such that a CTE of the detector array matches a CTE of the mosaic integrated circuit device 12 in the resultant focal plane array 10.

The integrated circuit tiles 18 may be, for example, read out integrated circuit (ROIC) tiles. The integrated circuit tiles 18 may include two or more vertically stacked integrated circuit dies/tiers to form a multi-tiered, 3-dimensional integrated circuit tile 18. For example, in the depicted embodiment, the integrated circuit tiles 18 each include three vertically stacked integrated circuit dies/tiers 18a, 18b, and 18c. The small die size of each of the vertically stacked integrated circuit dies 18a-c results in a high yield for each integrated circuit tile 18. The die size, for example, may be in the range of 8 mm×8 mm and 20 mm×20 mm. For example, in an embodiment, the die size is 10 mm×10 mm. It is understood, however, that these example die ranges and sizes are non-limiting, and that the optimal die size will be specific to the particular application of this disclosure.

Vertically stacking the two or more integrated circuit dies/tiers 18a-c to create a 3-dimensional integrated circuit tile 18 enables edge circuitry and peripheral area outside of the optically active pixel area to be minimized, resulting in a small size and high yield integrated circuit tile 18 for use in the focal plane array 10. For example, in the depicted embodiment having three vertically stacked integrated circuit dies/tiers 18a-c, a first tier 18a may include analog pixel circuitry and a second tier 18b may include digital counter circuitry. It is understood, however, that these examples are non-limiting, and that any other variety of circuitry may be provided on each tier. In any embodiment, a bottom tier (e.g., a third tier 18c) includes the various control logic, analog to digital conversion, memory, signal processing, multiplexing, data output, and other support circuitry related to the other tiers (e.g., the first tier 18a and the second tier 18b). In this manner, various control logic and support circuitry that would have otherwise been provided on the periphery of the first and second tiers 18a, 18b can be folded under in the 3-dimensional integrated circuit tile 18, minimizing the peripheral area outside of the pixel array on each die 18a-c. This allows for advanced functionality within a smaller pixel area and higher yield. In other embodiments, more tiers could be added to increase functionality and provide additional signal processing of the image prior to transmission off chip.

Figure 2A:
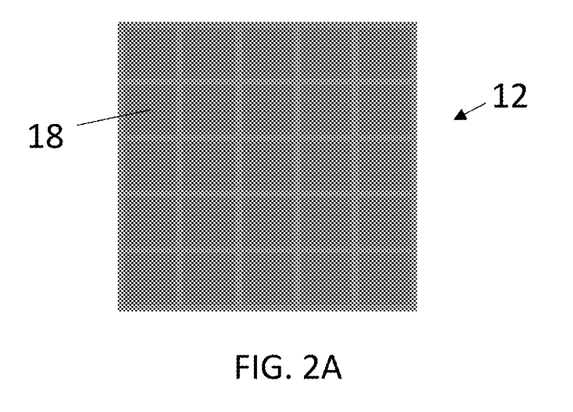
FIGS. 2A-C are schematic diagrams of alternative arrangements of integrated circuit tiles in the focal plane array of FIG. 1.
Figure 2B:
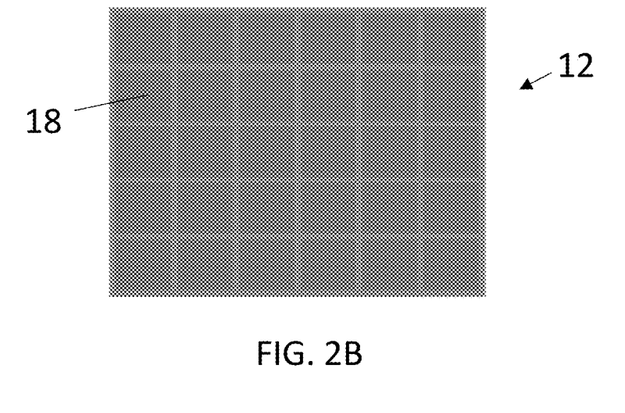
Figure 2C:
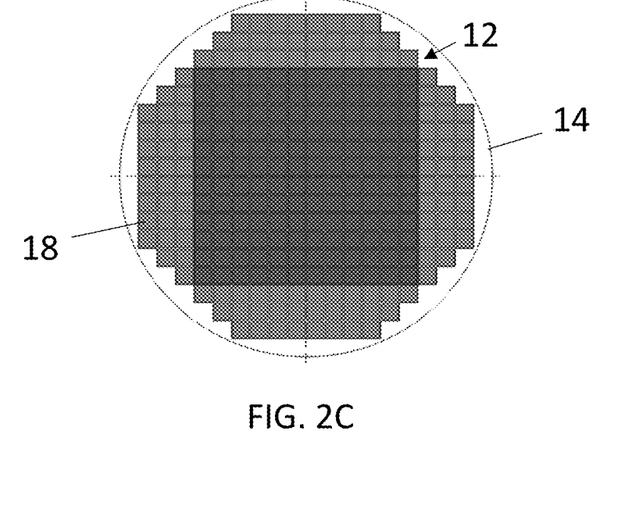

With reference to FIGS. 2A-C, the plurality of discrete integrated circuit tiles 18 that form the composite mosaic integrated circuit 12 may be arranged in a variety of ways. For example, the plurality of discrete integrated circuit tiles 18 may be arranged, in a square arrangement (FIG. 2A) or a rectangular arrangement (FIG. 2B). In another embodiment, the plurality of discrete integrated circuit tiles 18 may be arranged in a circular arrangement (FIG. 2C), for example, to more closely match an optical field of view which is typically circular in shape. The gaps between each of the discrete integrated circuit tiles 18 may be in the range of about 50 μm to 300 μm and may be, for example, 100 μm. It is understood, however, that the above described arrangements of the plurality of discrete integrated circuit tiles 18 are non-limiting examples and that other arrangements may be applicable depending on the particular application of this disclosure.

Figure 3:
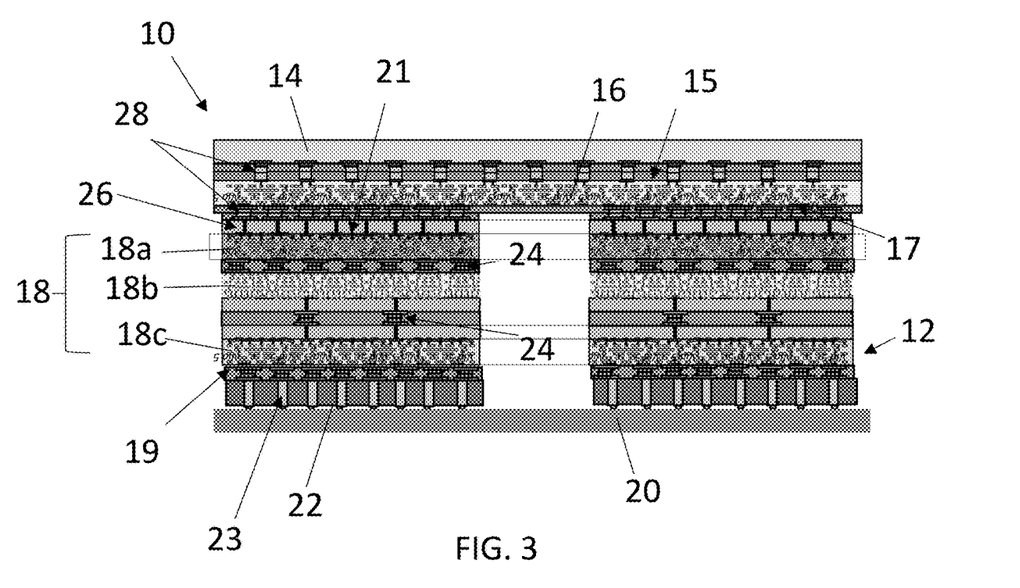
FIG. 3 is another schematic diagram of the focal plane array of FIG. 1.

With reference to FIG. 3, the first face 19 of each of the integrated circuit tiles 18, for example on the third tier 18c in the depicted embodiment having three vertically stacked integrated circuit dies/tiers 18a-c, is mounted on the motherboard 20 with direct bond hybridization (DBH) oxide bonds 24, through silicon vias (TSVs) 23, and BGA bonds 22. The second face 21 of each of the integrated circuit tiles 18, for example on the first tier 18a in the depicted embodiment having three vertically stacked integrated circuit dies/tiers 18a-c, is bonded to the second face 17 of the interposer 16 with DBH bonds 28 and foundry TSVs 26. The first face 15 of the interposer 16 is bonded to the detector array 14 with similar DBH bonds 28. In the embodiment having two or more vertically stacked integrated circuit dies 18a, 18b, 18c, the vertically stacked integrated circuit dies 18a-c are interconnected respectively with each other with, for example, DBH oxide bonds 24 such as nickel DBH bonds, and foundry TSVs. It is understood, however, that the depicted orientation (face up or face down) of each of the integrated circuit dies 18a, 18b, and 18c is a non-limiting example and that other orientations may be applicable to this disclosure. For example a top surface of integrated circuit die 18c could face the bottom of 18b and the BGA connections could be made through the back side of 18c instead.

Figure 4A:
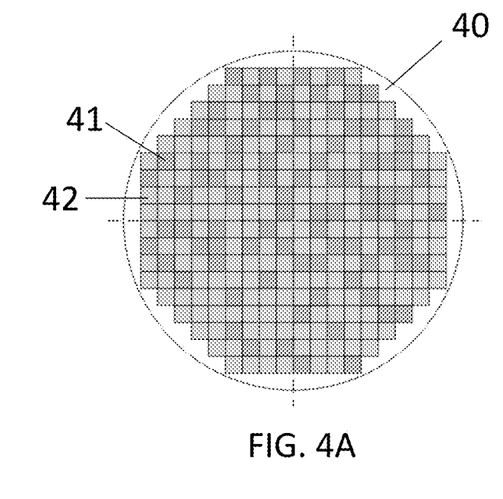
FIGS. 4A-D are schematic diagrams of a mosaic integrated circuit device during fabrication.
Figure 4B:
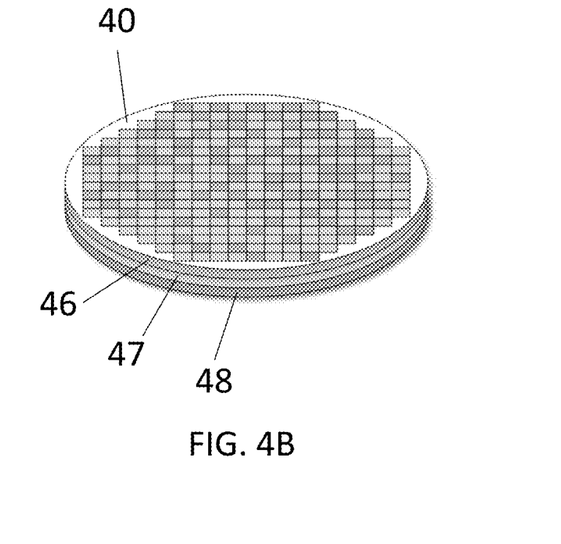
Figure 4C:
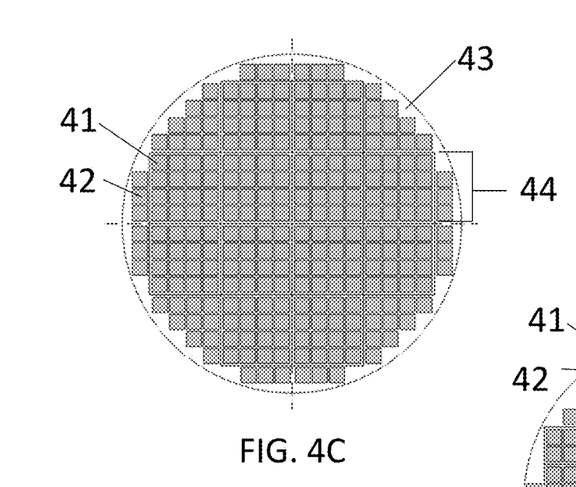
Figure 4D:
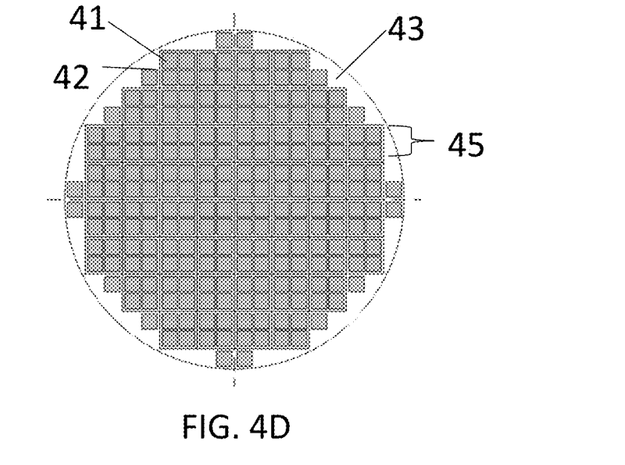

With reference to FIGS. 4A-D, the mosaic integrated circuit device 12 may be fabricated using the process described in U.S. Pat. No. 10,515,837, in which the mosaic integrated circuit device 12 is created from known good tiles/dies 41 and bad tiles/die 42. In an embodiment in which the plurality of integrated circuit tiles 18 of the mosaic integrated circuit device 12 include two or more vertically stacked integrated circuit dies 18a-c, for example, a wafer 40 having two or more layers 46, 47 and 48 of integrated circuit tiles 18 (FIG. 4B) is tested to determine which tiles/dies 18a-c are good (i.e., good tiles/dies 41) and which tiles/dies 18a-c are bad (bad tiles/dies 42). The wafer 40 is then diced to singulate the good tiles/dies 41 and the bad tiles/dies 42. Then, using the process described in U.S. Pat. No. 10,515,837, a composite wafer 43 is created from the known good tiles/dies 41 and bad tiles/dies 42 to form the mosaic integrated circuit device 12 (FIGS. 4C and 4D).

In the embodiment depicted in FIG. 4C, in particular, twelve 4 k×4 k die groups 44 are constructed on the composite wafer 43 using the known good tiles/die 41. The bad die 42 are used to fill in the composite wafer 43 outside the 4 k×4 k die group 44 boundaries. In another embodiment depicted in FIG. 4D, in particular, fifty two 2 k×2 k die groups 45 are constructed on the composite wafer 43 using the known good tiles/die 41. The bad die 42 are again used to fill in the composite wafer outside the 2 k×2 k die group 45 boundaries. It will be understood that the depicted and described embodiments are non-limiting and that other tile/die or die group configurations can be constructed on the composite wafer 43 using the concepts of this disclosure and that of U.S. Pat. No. 10,515,837.

Figure 5:
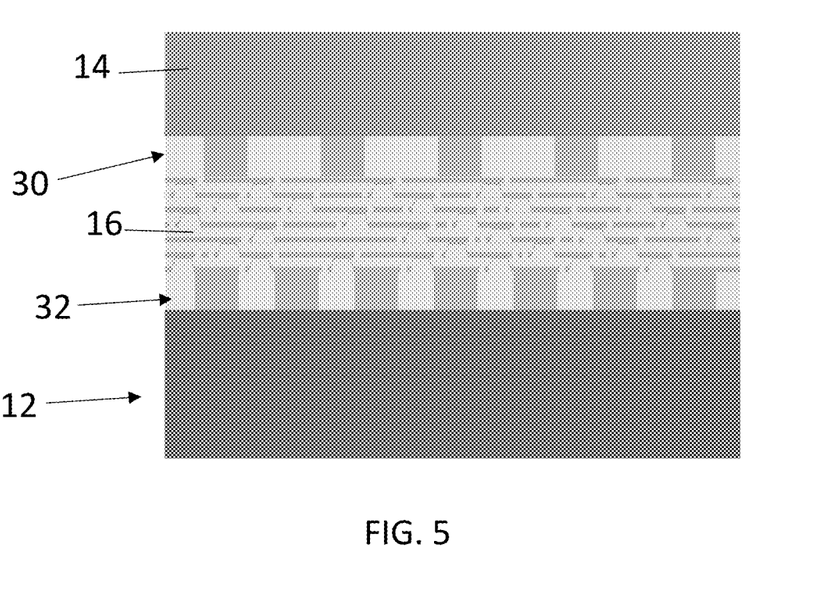
FIG. 5 is a magnified schematic diagram of an interposer in the focal plane array of FIG. 1.

With reference to FIG. 5, the interposer 16, disposed between the mosaic integrated circuit device 12 and the optically continuous detector array 14, is configured to adjust a pitch of the detector array 14 to match a pitch of each of the discrete integrated circuit tiles 18 so that any optical gaps between each of the plurality of integrated circuit tiles 18 are eliminated and an optically continuous detector array 14 is possible. The interposer 14, therefore, allows for a variety of detector arrays 14 having various detector pitches to be electrically connected with the mosaic integrated circuit device 12. For example, a detector array having a pitch in the range of 8 μm to 12 μm may be electrically connected to a single integrated circuit tile having a smaller pitch of 7.8 μm. It is understood, however, that this is a non-limiting example and that the interposer 14 is configured to allow an integrated circuit tile 18 having any range of pitches to be electrically connected with a detector array 14 having any range of pitches. In other embodiments, for example, a single integrated circuit tile 18 may have a pitch that is larger than that of a detector array 14 with which it is electrically connected with the interposer 14 therebetween.

As described above, the interposer 16 is bonded to the detector array 14 and the plurality of discrete integrated circuit tiles 18 of the mosaic integrated circuit device 12 with a simple substrate-removed back end of line (BEOL) foundry process to support modest pitch transformations from the detector array 14 to each of the plurality of integrated circuit tiles 18. In the embodiment depicted in FIG. 5, the interposer 16 is bonded to the detector array 14 with a relatively coarser DBH interface 30 as compared to a relatively finer DBH interface 32 with which the interposer 16 is bonded to each of the discrete integrated circuit tiles 18. In this way, the larger pitch of the detector interface 14 may be adjusted to match the smaller pitch of each integrated circuit tile 18. The interposer 16 may be a passive interposer wafer layer having a fan-in structure for matching the larger pitch of the detector array 14 to the smaller pitch of each of the plurality of integrated circuit tiles 18. In other embodiments in which the pitch of the detector array 14 is smaller than the pitch of each of the plurality of integrated circuit tiles 18, the interposer 16 may have a fan-out structure. Additionally, in other embodiments, the interposer 16 may be an active interposer having active transistors in the interposer 16. For example, these active transistors may be used to allow for detector deselect.

Figure 6:
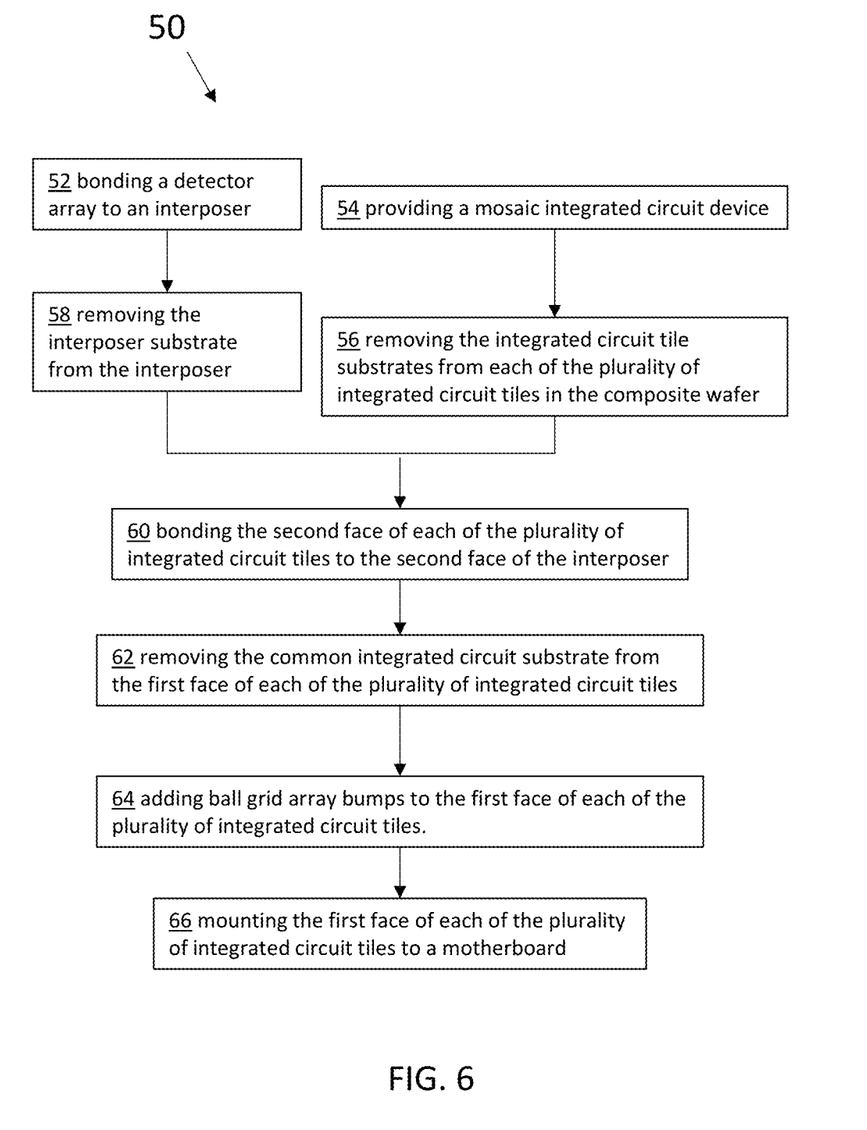
FIG. 6 is a flowchart of a method of fabricating a focal plane array.

With reference to FIG. 6, a method 50 of fabricating a focal plane array will now be described. This method 50 may be used when using detector materials, such as but not limited to mercury cadmium telluride (HgCdTe), indium gallium arsenide (InGaAs), and strained layer superlattice (III-V SLS/nBn) detectors, and/or Si detectors in the focal plane array. The method 50 includes a step 52 of bonding a face of a detector array to a first face of an interposer. The detector array and the interposer may be that as described above and depicted in FIGS. 1, 3 and 5. Specifically, with additional reference to FIG. 7A, a face 25 of the detector array 14 is bonded to the first face 15 of the interposer 16. Before the step 52 of bonding, the method 50 may include preparing the face 25 of the detector array 14 and the first face 15 of the interposer 16 for bonding. For example, preparing may include depositing an oxide on the respective face, etching holes for interconnects, filling the holes with metal (for example, nickel for a standard DBH bond) and then planarizing the face. The face may be planarized to a flatness of, for example, a few nanometers. The interposer 16 also has a second face 17 supported by the interposer substrate 33.

The method 50 also includes a step 54 of providing a mosaic integrated circuit device. For example, the mosaic integrated circuit device may be that as described above and depicted in FIGS. 1-5. Specifically, with additional reference to FIG. 7B, the mosaic integrated circuit device 12 includes a plurality of discrete integrated circuit tiles 18 supported on a common substrate 93 at a first face 19 of each of the plurality of integrated circuit tiles 18. Each of the plurality of integrated circuit tiles 18 also have a second face 21 opposite the first face 19 supported on an integrated circuit tile substrate 92.

Figure 7A:
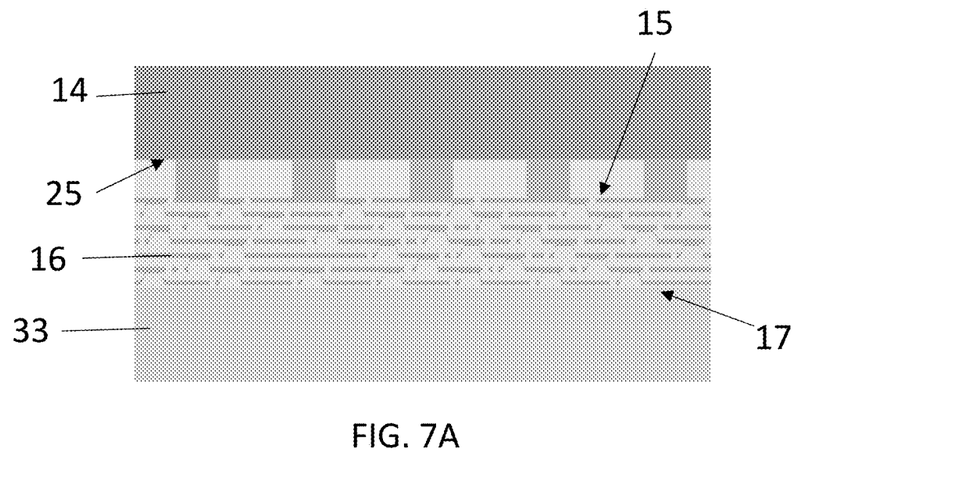
FIGS. 7A-B are schematic diagrams of a detector bonded to an interposer, and a mosaic integrated circuit device, respectively.
Figure 7B:
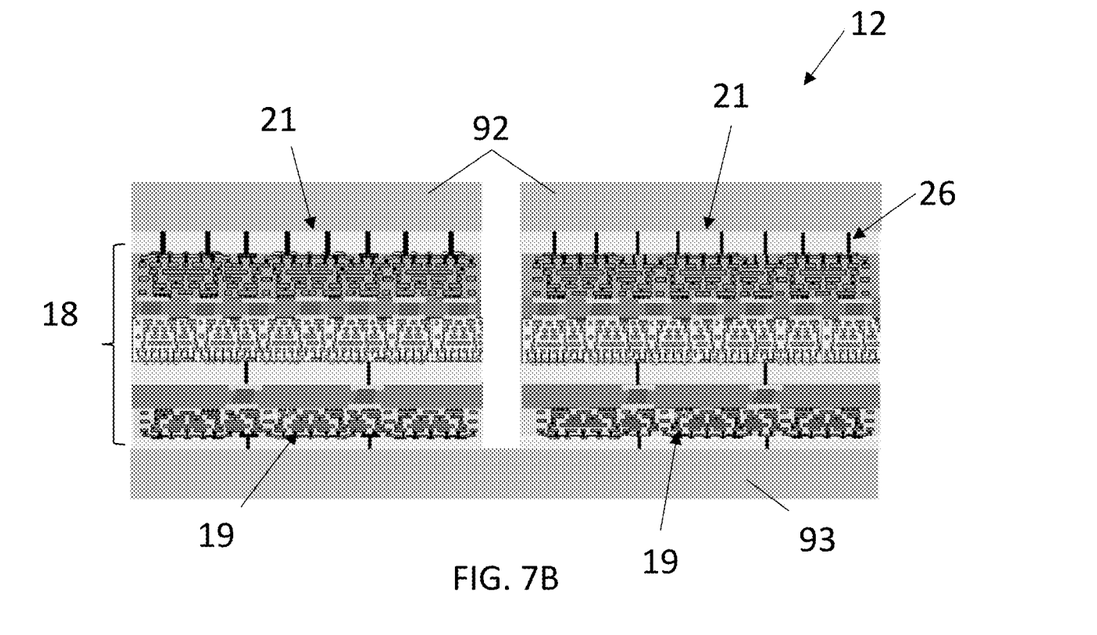

The method 50 then includes a step 56 of removing the integrated circuit tile substrate 92 from the second face 21 of each of the plurality of integrated circuit tiles 18 and a step 58 of removing the interposer substrate 33 from the second face 17 of the interposer 16 revealing the contacts or TSVs 26 that help form interconnects between the interposer 16 and the mosaic integrated circuit device 12. These TSVs or contacts may be in the interposer 16 and/or the plurality of integrated circuit tiles 18. The method 50 then includes a step 60 of bonding the second face 21 of each of the plurality of integrated circuit tiles 18 to the second face 17 of the interposer 16. Before the step 60 of bonding, the method 50 may include preparing the second face 17 of the interposer 16 and the second face 21 of each of the plurality of integrated circuit tiles 18 for bonding. The method 50 then includes a step 62 of removing the common composite integrated circuit substrate 93 from the first face 19 of each of the plurality of integrated circuit tiles 18, a step 64 of adding BGA bumps to the first face 19 of each of the plurality of integrated circuit tiles 18, and a step 66 of mounting the first face 19 of each of the plurality of integrated circuit tiles 18 to a motherboard.

The method 50 may additionally include adding I/O probe pads to the first face 19 of each of the plurality of integrated circuit tiles 18 and testing the mosaic integrated circuit device 12 before adding the BGA bumps to the first face 19 of each of the plurality of discrete integrated circuit tiles 18.

Figure 8:
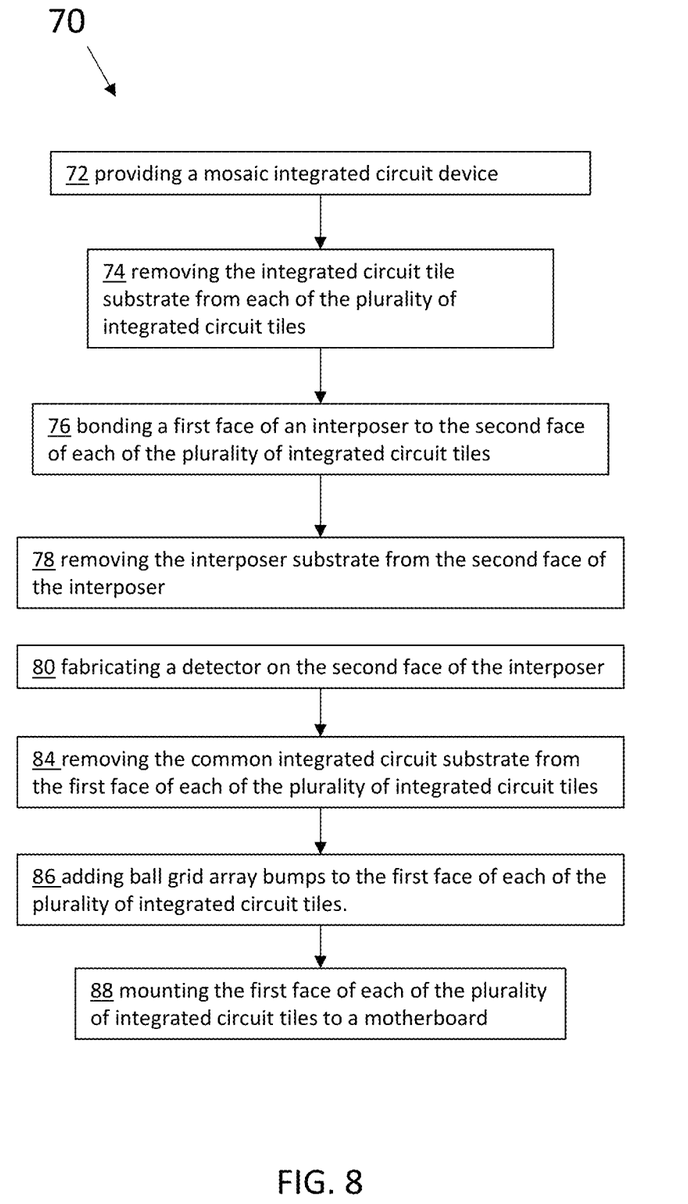
FIG. 8 is a flowchart of another method of fabricating a focal plane array.

With reference to FIG. 8, another method 70 of fabricating a focal plane array will be described. This method 70 may be used, for example, when using an uncooled microbolometer as a detector in the focal plane array. The method 70 includes a step 72 of providing a mosaic integrated circuit device, such as the mosaic integrated circuit device 12 described above and depicted in FIGS. 1-4D. Again, with reference to FIG. 7B, the mosaic integrated circuit device 12 includes a plurality of discrete integrated circuit tiles 18 supported on a common integrated circuit substrate 93 at a first face 19 of each of the plurality of integrated circuit tiles 18. Each of the plurality of integrated circuit tiles has a second face 21 opposite the first face 19 supported on an integrated circuit tile substrate 92. The method 70 then includes a step 74 of removing the integrated circuit tile substrate 93 from the second face 21 of each of the plurality of integrated circuit tiles 18 and a step 76 of bonding a first face 15 of an interposer 16 to the second face 21 of each of the integrated circuit tiles 18. The interposer 16 also has a second face 17 supported on an interposer substrate 33. Before the step 76 of bonding, the method 70 may include preparing the second face 21 of each of the plurality of integrated circuit tiles 18 and the first face 15 of the interposer 16 for bonding.

The method 70 then includes a step 78 of removing the interposer substrate 33 from the second face 17 of the interposer 16 and a step 80 of fabricating a detector on the second face 17 of the interposer 16. The method 70 then includes a step 84 of removing the common integrated circuit substrate 93 from the first face 19 of each of the plurality of integrated circuit tiles 18, a step 86 of adding BGA bumps to the first face 19 of each of the plurality of integrated circuit tiles 18 and a step 88 of mounting the first face 19 of each of the plurality of integrated circuit tiles 18 to a motherboard.

Similarly to the method 50 described above, the method 70 may additionally include adding I/O probe pads to the first face 19 of each of the plurality of integrated circuit tiles 18 and testing the mosaic integrated circuit device 12 before adding the BGA bumps to the first face 19 of each of the plurality of discrete integrated circuit tiles 18 to the motherboard.

It is understood that the method 70 may be applicable to any detector that is monolithically integrated or fabricated directly on the surface of the readout integrated circuit. For example, the detector may be a monolithically integrated detector such as a micro-bolometer, a mercury cadmium telluride (HgCdTe) detector, a graphene or other nano wire based detector, a silicon-germanium (SeGe) detector, a silicon-germanium tin (SeGeSn) detector, a lead selenide (PbSe) or other lead based detector, a nano-particle detector, or a quantum-dot detector. Accordingly, step 80 may be replaced by an equivalent process for fabricating such a monolithically integrated detector.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A focal plane array comprising:
a mosaic integrated circuit device including a plurality of integrated circuit tiles each having a first face mounted to a motherboard;
a detector array electrically connected to a second face of each integrated circuit tile; and
an interposer disposed between the detector array and the second face of each of the plurality of integrated circuit tiles of the mosaic integrated circuit device, wherein first spacings of a first direct bond hybridization (DBH) interface of the interposer bonded to the detector array are coarser than second spacings of a second DBH interface of the interposer bonded to each of the plurality of integrated circuit tiles;
wherein a coefficient of thermal expansion of the detector array substantially matches a coefficient of thermal expansion of the mosaic integrated circuit device; and
wherein the interposer comprises transistors configured to deselect detectors in the detector array.

2. The focal plane array according to claim 1, wherein the integrated circuit tiles are read-out integrated circuit devices.

3. The focal plane array according to claim 1, wherein the integrated circuit tiles include two or more vertically-stacked integrated circuit dies.

4. The focal plane array according to claim 3, wherein the integrated circuit tiles include a DBH layer between each adjacent pair of circuit dies of the two or more vertically-stacked integrated circuit dies.

5. The focal plane array according to claim 1, wherein the interposer includes a fan-in or fan-out structure for matching a pitch of the detector array to a pitch of each of the plurality of integrated circuit tiles.

6. The focal plane array according to claim 1, wherein the integrated circuit tiles of the mosaic integrated circuit device are in a square configuration.

7. The focal plane array according to claim 1, wherein the integrated circuit tiles of the mosaic integrated circuit device are in a rectangular configuration.

8. The focal plane array according to claim 1, wherein the integrated circuit tiles of the mosaic integrated circuit device are in a circular configuration.

9. The focal plane array according to claim 1, wherein the detector array is at least one of an infrared detector, a visible detector, a UV detector, and an x-ray detector.

10. The focal plane array according to claim 1, wherein the detector array is a micro-bolometer or other monolithically integrated detector material.

11. The focal plane array according to claim 1, wherein each integrated circuit tile of the plurality of integrated circuit tiles has through silicon vias (TSVs) formed between ball-grid array (BGA) bonds positioned at least between the first face and the motherboard.

12. A method of fabricating a focal plane array, the method comprising:
bonding a face of a detector array to a first face of an interposer, the interposer having a second face supported on an interposer substrate;
providing a mosaic integrated circuit device, the mosaic integrated circuit device including a plurality of integrated circuit tiles supported on a common integrated circuit substrate at a first face of each of the plurality of integrated circuit tiles, each of the plurality of integrated circuit tiles having a second face opposite the first face supported on an integrated circuit tile substrate;
removing the integrated circuit tile substrate from the second face of each of the plurality of integrated circuit tiles;
removing the interposer substrate from the second face of the interposer;
bonding the second face of each of the plurality of integrated circuit tiles to the second face of the interposer, wherein first spacings of a first direct bond hybridization (DBH) interface of the interposer bonded to the detector array are coarser than second spacings of a second DBH interface of the interposer bonded to each of the plurality of integrated circuit tiles;
removing the common integrated circuit substrate from the first face of each of the plurality of integrated circuit tiles; and
mounting the first face of each of the plurality of integrated circuit tiles to a motherboard;

wherein a coefficient of thermal expansion of the detector array substantially matches a coefficient of thermal expansion of the mosaic integrated circuit device; and
wherein the interposer comprises transistors configured to deselect detectors in the detector array.

13. The method according to claim 12, further comprising:
preparing the face of the detector array and the first face of the interposer for bonding before bonding the face of the detector array to the first face of the interposer.

14. The method according to claim 12, further comprising:
preparing the second face of the interposer and the second face of each of the plurality of integrated circuit tiles for bonding before bonding the second face of each of the plurality of integrated circuit tiles to the second face of the interposer.

15. The method according to claim 12, further comprising:
adding I/O probe pads to the first face of each of the plurality of integrated circuit tiles and testing the mosaic integrated circuit device before mounting the first face of each of the plurality of integrated circuit tiles to the motherboard.

16. The method according to claim 12, further comprising:
adding ball grid array bumps to the first face of each of the plurality of integrated circuit tiles before mounting the first face of each of the plurality of integrated circuit tiles to the motherboard.

17. The method of claim 12, wherein the interposer includes a fan-in or fan-out structure for matching a pitch of the detector array to a pitch of each of the plurality of integrated circuit tiles.

18. The method of claim 12, wherein the integrated circuit tiles of the mosaic integrated circuit device are in a square, rectangular, or circular configuration.

19. The method of claim 12, wherein the detector array is at least one of an infrared detector, a visible detector, a UV detector, and an x-ray detector.

20. The method of claim 12, wherein the detector array is a micro-bolometer or other monolithically integrated detector material.

21. The method of claim 12, wherein the integrated circuit tiles are read-out integrated circuit devices.

* * * * *